(12) United States Patent
Cheng et al.

(10) Patent No.: US 10,534,232 B2
(45) Date of Patent: Jan. 14, 2020

(54) ARRAY SUBSTRATE AND MANUFACTURING METHOD THEREOF

(71) Applicant: Shenzhen China Star Optoelectronics Technology Co., Ltd., Shenzhen (CN)

(72) Inventors: Xiaoping Cheng, Shenzhen (CN); Yungjui Lee, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/424,461

(22) Filed: May 28, 2019

(65) Prior Publication Data

US 2019/0293979 A1    Sep. 26, 2019

Related U.S. Application Data

(63) Continuation of application No. 15/989,158, filed on May 24, 2018, now Pat. No. 10,371,999.

(30) Foreign Application Priority Data

Sep. 24, 2015 (CN) .......................... 2015 1 0618853

(51) Int. Cl.
| | |
|---|---|
| H01L 27/12 | (2006.01) |
| G02F 1/1362 | (2006.01) |
| G02F 1/13357 | (2006.01) |
| G02F 1/1368 | (2006.01) |
| H01L 27/32 | (2006.01) |

(52) U.S. Cl.
CPC .......... *G02F 1/1362* (2013.01); *G02F 1/1368* (2013.01); *G02F 1/133617* (2013.01); *H01L 27/1248* (2013.01); *H01L 27/1262* (2013.01); *G02F 2001/136222* (2013.01); *G02F 2201/086* (2013.01); *G02F 2201/50* (2013.01); *G02F 2202/36* (2013.01); *H01L 27/1292* (2013.01); *H01L 27/322* (2013.01); *H01L 27/3258* (2013.01); *H01L 2251/5369* (2013.01)

(58) Field of Classification Search
CPC combination set(s) only.
See application file for complete search history.

(56) References Cited

U.S. PATENT DOCUMENTS

| | | | | |
|---|---|---|---|---|
| 2016/0033822 | A1* | 2/2016 | Jiang | G02F 1/13338 349/33 |
| 2017/0059928 | A1* | 3/2017 | Kim | G02F 1/133514 |
| 2017/0146857 | A1* | 5/2017 | Wang | G02F 1/133621 |
| 2017/0255055 | A1* | 9/2017 | Liang | G02F 1/133621 |
| 2018/0275461 | A1* | 9/2018 | Park | G02F 1/133512 |

* cited by examiner

*Primary Examiner* — Thao P Le
(74) *Attorney, Agent, or Firm* — Leong C. Lei

(57) ABSTRACT

A manufacturing method of an array substrate includes the steps of providing a base plate and forming a thin-film transistor (TFT) layer on the base plate; forming a quantum dot layer on the TFT layer; and forming a protective filter layer on the quantum dot layer to provide protection to the quantum dot layer. The protective filter layer also provides an effect of light filtering in order to prevent ultraviolet light or blue light from transmitting therethrough and allows light of red and green colors to pass.

15 Claims, 4 Drawing Sheets

ARRAY SUBSTRATE AND MANUFACTURING METHOD THEREOF

CROSS REFERENCE TO RELATED APPLICATIONS

This is a continuation application of co-pending U.S. patent application Ser. No. 15/989,158, filed on May 24, 2018, which is a divisional application of U.S. patent application Ser. No. 14/914,619, filed on Feb. 25, 2016 and now U.S. Pat. No. 10,007,156, which is a national stage of PCT Application No. PCT/CN2015/098341, filed on Dec. 22, 2015, claiming foreign priority of Chinese Patent Application No. 201510618853.6, filed on Sep. 24, 2015.

BACKGROUND OF THE INVENTION

1. Field of the Invention

The present invention relates to the field of display technology, and in particular to an array substrate and a manufacturing method thereof.

2. The Related Arts

Liquid crystal displays (LCDs) have a variety of advantages, such as thin device body, low power consumption, and being free of radiation, and are thus widely used in for example liquid crystal televisions, mobile phones, personal digital assistants (PDAs), digital cameras, computer monitors, and notebook computer screens. The liquid crystal display generally comprises an enclosure, a liquid crystal display panel arranged in the enclosure, and a backlight module mounted in the enclosure. The structure of the liquid crystal display panel is generally made up of a thin-film transistor (TFT) array substrate, a color filter (CF) substrate, and a liquid crystal layer between the two substrates and the operation principle is that a drive voltage is applied to the two glass substrates to control liquid crystal molecules of the liquid crystal layer to rotate in order to refract out light from a backlight module to generate an image.

Quantum dots are nanometer semiconductor crystals having a radius smaller than or close to Bohr radius and most are three-dimensional nanometer materials composed of elements of II-VI group or III-V group. Due to the quantum confinement effect, the transportation of electrons and holes in the quantum dots is constrained so as to change the continuous energy band into discrete energy levels. When the size of the quantum dot differs, the quantum confinement effect exhibits on electrons and holes is different, making the structure of discrete energy levels different. When excited by an external energy, quantum dots of different sizes give off light of different wavelengths, namely different colors of light. The advantages of quantum dot are that by adjusting the size of the quantum dot, it is possible to provide a range of wavelength of light emission that covers the infrared light and the entire visible light band and the waveband of the emission light is narrow with high degree of color saturation. The quantum dot material shows a high quantum conversion efficiency and the property of the material is stable. The manufacturing process and simple and diverse, allowing manufacturing thereof from solutions, of which the resources are rich. The quantum dot may absorb blue light that has a relatively short wavelength and, after being excited, exhibits a light color of a relatively long waveband. Such characteristics make the quantum dot capable of changing the color the light emitting from a backlight source.

A conventional liquid crystal display panel relies on color filtering achieved with an arrangement of color filter layers, such as a red filter layer, a green filter layer, and a blue filter layer, therein in order to convert white light emitting from a light source into monochromic light, such as red, green, and blue. The color filter layers of different colors allow light of different wavebands to pass so as to achieve colorful displaying of a liquid crystal display panel. With the advance of science and technology, people desire continuous improvement of color saturation and gamut for the liquid crystal display panel. To expand the color gamut range of a liquid crystal display panel requires increasing the color purity of the color filter layers and this in turn requires the content of pigment to be increased. This, however, lowers down light transmission rate of the color filter layer. Further, to maintain the display brightness of the liquid crystal display panel, it also needs to increase the intensity of emission light of the light source and this would lead to increased power consumption of the liquid crystal display panel.

The quantum dot technology brings total upgrading in all sectors, such as color gamut coverage, preciseness of color control, color purity of red, green, and blue colors and realizes, in an evolutionary way, full color displaying, providing the most realistic way of restoration of genuine color of an image, and is thus considered the world-wide high spot of display techniques and affecting the global revolution of display technology. The conventional quantum dot display technology is achieved by directly introducing quantum dots into between two substrates (a liquid crystal cell) of a liquid crystal display panel in order to supplement the insufficiency of color displaying with the color filter layers and to expand the range of displayed color gamut. However, the conventional manufacturing operations of the liquid crystal display panels constrain the exploitation of quantum dot performance. It is a issue to be studies for further improving the stability of quantum dots.

SUMMARY OF THE INVENTION

An object of the present invention is to provide an array substrate, wherein a quantum dot layer and a protective filter layer are provided on the array substrate to compensate the insufficiency of color displaying of an existing color filter layer, expand the range of color gamut, and also overcome the issues of poor performance and stability of the prior art quantum dots.

Another object of the present invention is to provide a manufacturing method of an array substrate, wherein the method allows for easy and simple formation of a quantum dot layer and a protective filter layer on an array substrate to compensate the insufficiency of color displaying of an existing color filter layer, expand the range of color gamut, and also overcome the issues of poor performance and stability of the prior art quantum dots.

To achieve the above objects, the present invention provides an array substrate, which comprises: a base plate, a TFT layer arranged on the base plate, a quantum dot layer arranged on the TFT layer, and a protective filter layer arranged on the quantum dot layer;

the protective filter layer forming dense protection to the quantum dot layer, the protective filter layer providing an effect of light filtering, the protective filter layer filtering ultraviolet light or blue light within a predetermined waveband.

The quantum dot layer contains therein quantum dots that comprises nanometer particles formed of one or multiple of semiconductors comprising elements of IIB-VIA group, semiconductors comprising elements of IIIA-VA group, and carbon quantum dot, the quantum dots having a stable diameter of 0-20 nm.

The quantum dot layer emits light having a color of red, green, blue, yellow, and purple or a combination of multiple ones thereof.

The protective filter layer is formed of a material comprising one of silicon nitride, silicon oxide, indium tin oxide, polyimide, and polyfluorene derivatives.

The protective filter layer comprises a color filter layer formed thereon.

The present invention also provides an array substrate manufacturing method, which comprises the following steps:

(1) providing a base plate and forming a TFT layer on the base plate;

(2) forming a quantum dot layer on the TFT layer; and (3) forming a protective filter layer on the quantum dot layer.

Step 2 is specifically performed by applying a vapor deposition process to form a quantum dot film on the TFT layer so as to form the quantum dot layer.

Step 2 is specifically performed by providing a quantum dot material and a dissolving medium, dissolving and dispersing the quantum dot material in the dissolving medium and uniformly mixed to form a quantum dot paste, and applying the quantum dot paste to form a film on the TFT layer and drying and curing to obtain the quantum dot layer.

In Step 2, the quantum dot material is oil soluble or water soluble; the quantum dots are in the form of spheres, bars, or fibrous forms; the dissolving medium is silica series or epoxy series; and in Step 2 the quantum dot paste is applied to the TFT layer to form the film by means of spray coating, spin coating, printing, or slot-die coating.

The array substrate manufacturing method further comprises:

(4) forming a color filter layer on the protective layer.

The present invention further provides an array substrate, which comprises: a base plate, a TFT layer arranged on the base plate, a quantum dot layer arranged on the TFT layer, and a protective filter layer arranged on the quantum dot layer;

the protective filter layer forming dense protection to the quantum dot layer, the protective filter layer providing an effect of light filtering, the protective filter layer filtering ultraviolet light or blue light within a predetermined waveband;

wherein the quantum dot layer contains therein quantum dots that comprises nanometer particles formed of one or multiple of semiconductors comprising elements of IIB-VIA group, semiconductors comprising elements of IIIA-VA group, and carbon quantum dot, the quantum dots having a stable diameter of 0-20 nm;

wherein the quantum dot layer emits light having a color of red, green, blue, yellow, and purple or a combination of multiple ones thereof; and wherein the protective filter layer is formed of a material comprising one of silicon nitride, silicon oxide, indium tin oxide, polyimide, and polyfluorene derivatives.

The efficacy of the present invention is that the present invention provides an array substrate. The array substrate comprises a quantum dot layer, and a protective filter layer is formed on the quantum dot layer. The quantum dot layer helps improve color saturation and color purity and expands the range of color gamut. The protective filter layer provide dense protection to the quantum dot layer to prevent damages induced on the quantum dot layer by subsequent manufacturing processes and also prevents impurities contained in the quantum dot paste from entering the liquid crystal layer to affect the performance of displaying. Further, the protective filter layer provides an effect of light filtering and may prevent a portion of UV backlighting or laser backlighting, which remains after the backlighting has been used to excite the quantum dots, from transmitting therethrough so as to improve the efficiency and stability of the quantum dot layer. The present invention also provides an array substrate manufacturing method. The method can be easily carried out and forms a quantum dot layer on an array substrate to supplement the insufficiency of color displaying of a conventional color filter layer and expand the range of color gamut. By forming a protective filter layer on the quantum dot layer, the efficiency and stability of the quantum dot layer can be improved.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
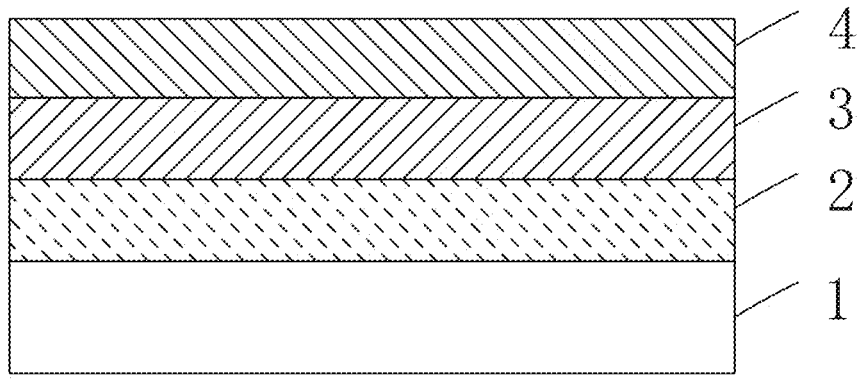
FIG. 1 is a schematic view illustrating the structure of a first embodiment of an array substrate according to the present invention.

Referring to FIG. 1, firstly, the present invention provides an array substrate, which comprises: a base plate 1, a thin-film transistor (TFT) layer 2 arranged on the base plate 1, a quantum dot layer 3 arranged on the TFT layer 2, and a protective filter layer 4 arranged on the quantum dot layer 3.

Specifically, the quantum dot layer 3 contains quantum dots that are nanometer particles having a stable diameter of 0-20 nm formed of one or multiple of semiconductors comprising elements of IIB-VIA group (such as cadmium sulfide (CdS), cadmium selenide (CdSe), cadmium telluride (CdTe), and zinc selenide (ZnSe)), semiconductors comprising elements of IIIA-VA group (such as indium phosphide (InP), and indium assenide (InAs)), and other quantum dot materials, such as carbon quantum dot.

Figure 5:
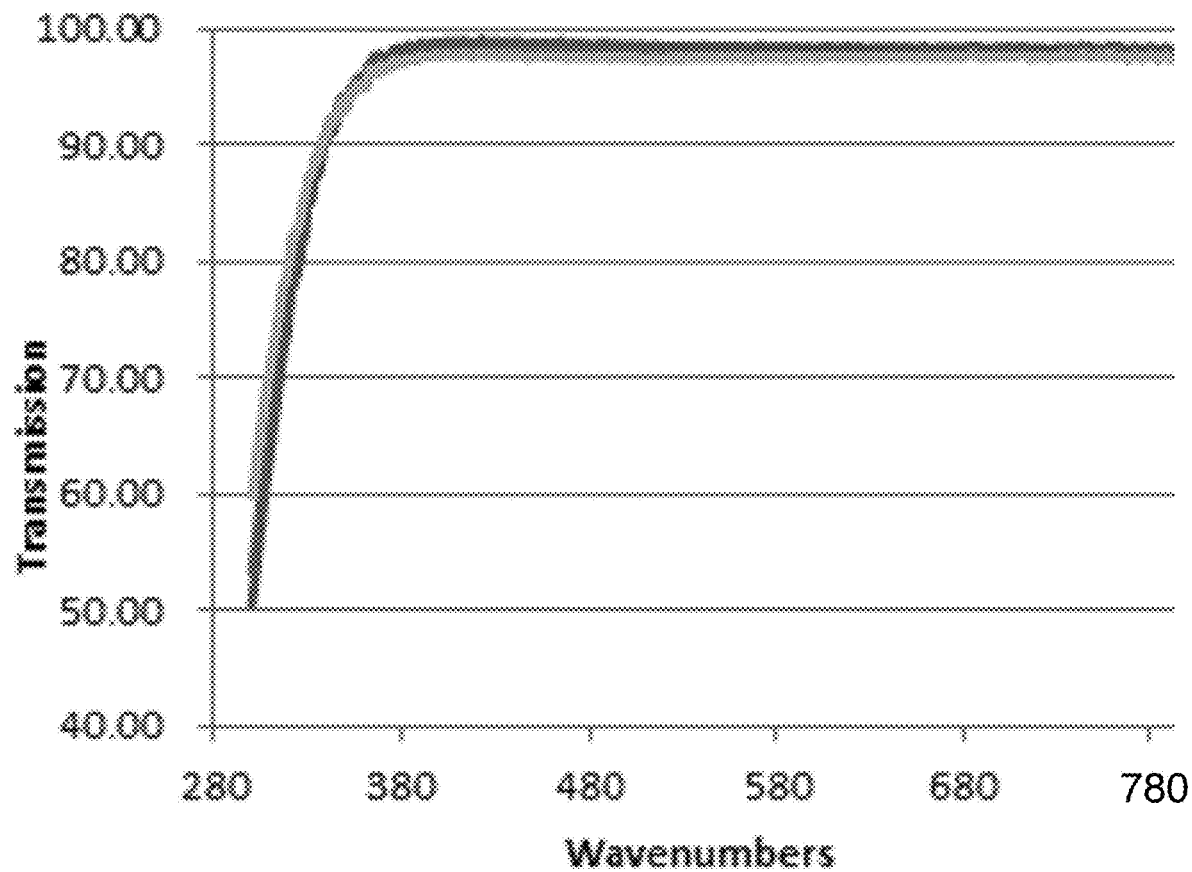
FIG. 5 shows a plot of transmission spectrum of a polyimide material film.

Specifically, emission light colors of the quantum dot layer 3 include, but not limited to, one of red, green, blue, yellow, and purple or a combination of multiple ones thereof. The quantum dot layer 3 can be a film layer formed on an entire surface by means of a monocolor quantum dot or mixed multicolor quantum dots, or can alternatively be a film layer involving a pixel pattern by subjecting monocolor quantum dots or multicolor quantum dots to a patterning operation. Specifically, the protective filter layer 4 is formed of a material that is selected from inorganic materials, such as silicon nitride (SiNx), silicon oxide (SiO2), indium tin oxide (ITO), or organic materials, such as polyimide (PI) and polyfluorene (PFN) derivatives. These materials exhibit an effect of light filtering and may cut off ultraviolet light (UV) or blue light having a short wavelength and provide an excellent effect filtering for the ultraviolet light or blue light of short wavelengths, and exhibit an excellent effect of transmission for visible light having a relatively long wavelength and allows for improvement of filtering effect by adjusting molecular structures thereof. As shown in FIG. 5, a polyimide film shows a high transmission rate for light of wavelength of 380-780 nm and has an abruptly lowered transmission rate for short wavelength light having a wavelength less than 380 nm to thus provide an excellent effect of filtering for ultraviolet light having a short wavelength.

The protective filter layer 4 provides dense protection to the quantum dot layer 3 to prevent damages induced on the quantum dot layer 3 by subsequent manufacturing processes (such as development operation and water washing operation of the color filter layer) and also to prevent impurities contained in the quantum dot paste from entering the liquid crystal layer to affect the performance of displaying. Further, the protective filter layer 4 also provides an effect of light filtering and may prevent a portion of UV backlighting or laser backlighting, which remains after the backlighting has been used to excite the quantum dots, from transmitting out. Taking a quantum dot layer 3 of which the color of emission light is red or green and the backlighting emitting from a backlight module being blue light as an example, the arrangement of the protective filter layer 4 can be used to filter off blue light to prevent a remaining portion the blue light that has not been put into effect in exciting the quantum dot layer 3 from transmitting through the protective filter layer 4 after the blue light has been applied for excitement purpose, so as to increase the emission efficiency of the quantum dot layer 3, while the protective filter layer 4 allows red or green light to transmit therethrough for color displaying.

Figure 2:
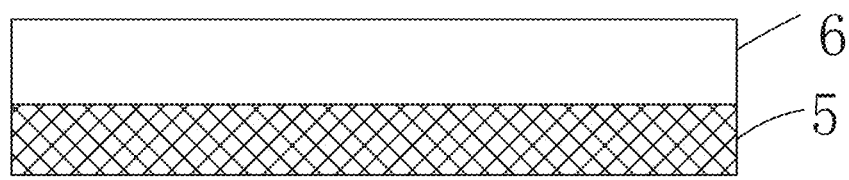
FIG. 2 is a schematic view illustrating the structure of a display panel that includes the array substrate illustrated in FIG. 1.
Figure 2:
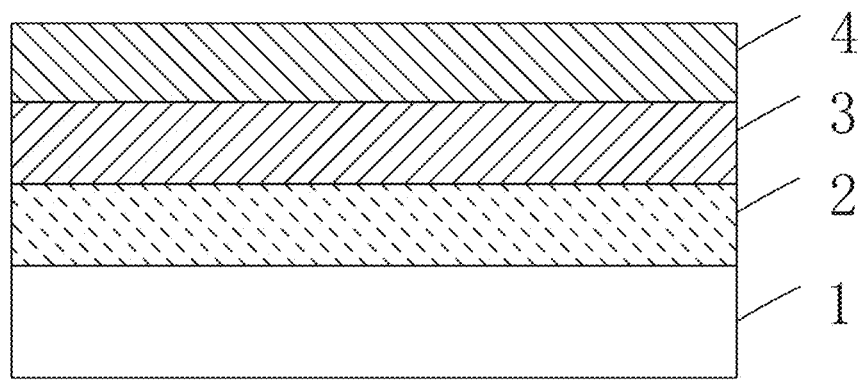
Figure 4:
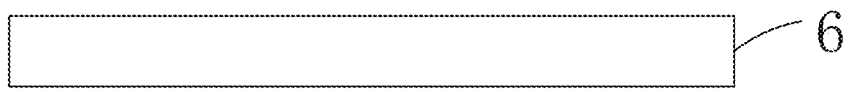
FIG. 4 is a schematic view illustrating the structure of a display panel that includes the array substrate illustrated in FIG. 3.
Figure 4:
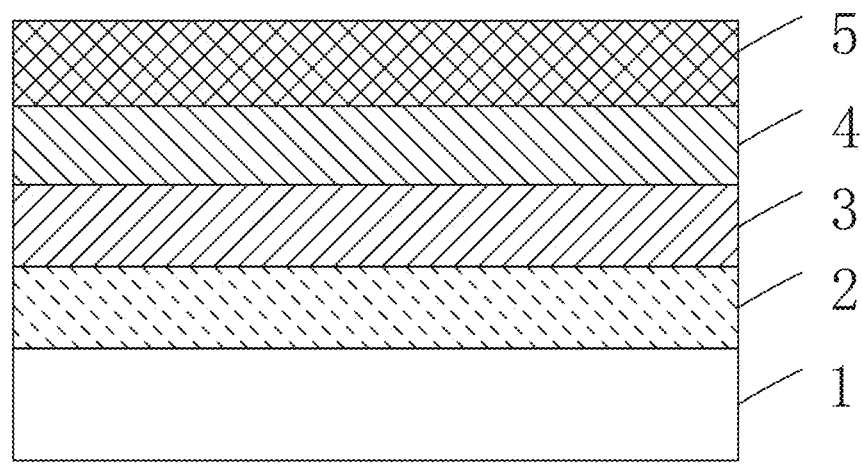

Referring to FIGS. 2 and 4, the array substrate is laminated with a package lid to form a display panel. The display panel can be a COA (Color Filter On Array) panel or a non-COA panel. Further, the present invention imposes no limitations to the driving mode applicable to the display panel and is equally applicable to various modes, including in-plane switching (IPS), twisted nematic (TN), vertical alignment (VA), organic light emitting diode (OLED), and quantum dot LED (QLED).

As shown in FIG. 2, the display panel illustrated in a non-COA panel, wherein a color filter layer 5 is arranged on a base plate 6 of a package lid.

Figure 3:
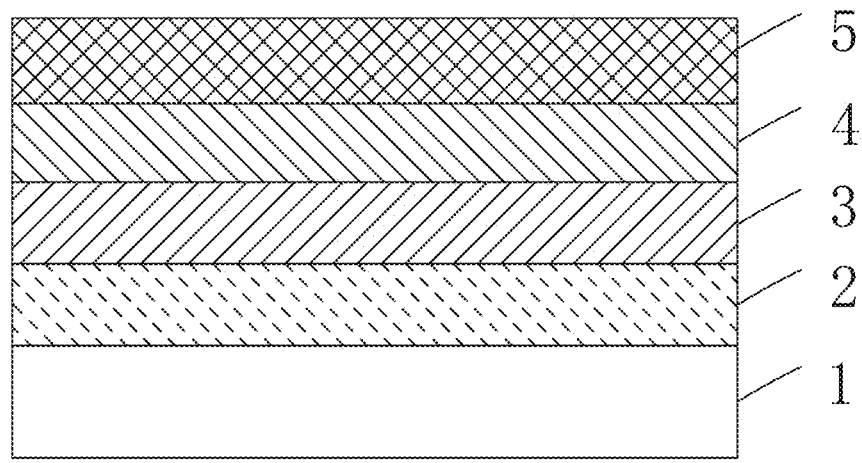
FIG. 3 is a schematic view illustrating the structure of a second embodiment of the array substrate according to the present invention.

In addition, referring to FIG. 3 in combination with FIG. 4, FIG. 4 illustrates a display panel that is a COA panel and a color filter layer 5 is arranged on a protective filter layer 4 of an array substrate.

Figure 6:
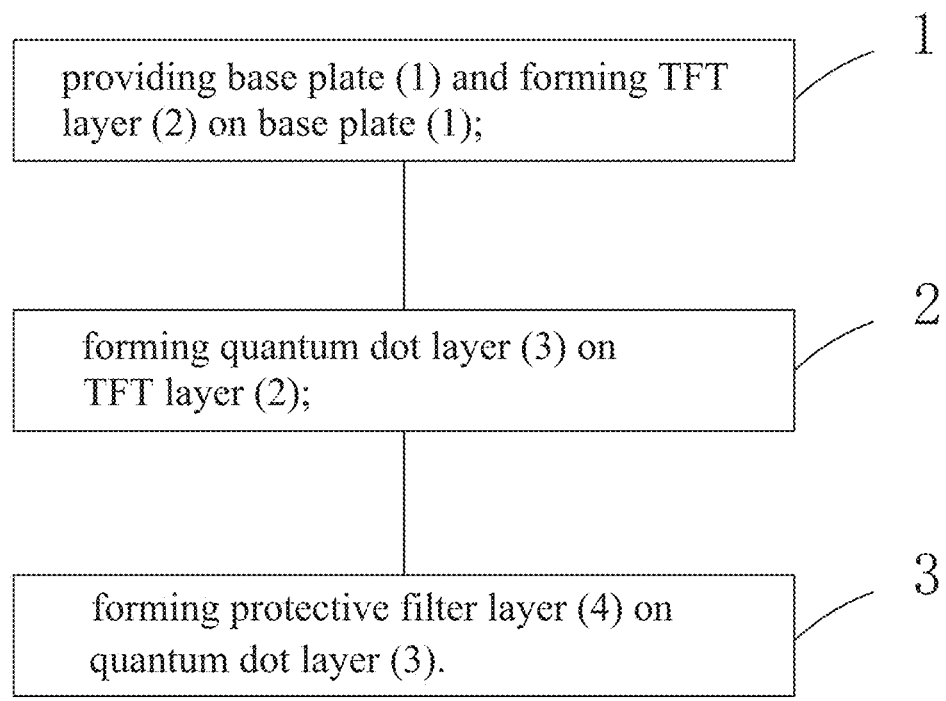
FIG. 6 is a flow chart illustrating a manufacturing method of the array substrate according to the present invention.

Referring to FIG. 6, in combination with FIG. 1, the present invention also provides an array substrate manufacturing method, which comprises the following steps:

Step 1: providing abase plate 1 and forming a TFT layer 2 on the base plate 1.

Specifically, the base plate 1 is a transparent plate, preferably a glass plate. The TFT layer 2 comprises a plurality of TFT units arranged in an array and pixel electrodes connected to the TFT units.

Step 2: forming a quantum dot layer 3 on the TFT layer 2.

Specifically, in Step 2, a quantum dot material and a dissolving medium are provided. The quantum dot material is dissolved and dispersed in the dissolving medium and is uniformly mixed to form a quantum dot paste. The quantum dot paste is then applied to form a film on the TFT layer 2 and is then dried and cured to form the quantum dot layer 3.

In Step 2, the quantum dot material provided may be obtained by application of one of various non-limiting processes, such as surface grafting or surface coating, for modifying the quantum dot, in order to make it compatible with the dissolving medium and being oil soluble or water soluble. The quantum dots of the quantum dot material can be of any suitable shape, such as sphere, bar, or a fibrous form. The dissolving medium can be silica series or epoxy series dissolving medium systems and may be specifically selected according to multiple factors, including light emission characteristics and dissolving behavior of the quantum dots and the percentages of the ingredient components and the mixture ratio thereof with respect to the quantum dots can be adjusted according to the desired result of mixture in order to provide an optimum result of mixture. The process that the quantum dot paste is applied to form a film on the TFT layer 2 in Step 2 includes spray coating, spin coating, printing, and slot-die coating.

Or alternatively, in Step 2, the quantum dot layer 3 can be a layer of quantum dot film formed on the TFT layer 2 through vapor deposition.

The quantum dot layer 3 can be a film layer formed on an entire surface by means of a monocolor quantum dot or mixed multicolor quantum dots, or can alternatively be a film layer involving a pixel pattern by subjecting monocolor quantum dots or multicolor quantum dots to a patterning operation. If the quantum dot layer 3 is a patterned film layer, then a corresponding patterning operation must be included in Step 2.

Step 3: forming a protective filter layer 4 on the quantum dot layer 3.

Specifically, the protective filter layer 4 is formed of a material that is selected from inorganic materials, such as silicon nitride (SiNx), silicon oxide (SiO2), indium tin oxide (ITO), or organic materials, such as polyimide (PI) and polyfluorene (PFN) derivatives. These materials exhibit an effect of light filtering and may cut off ultraviolet light (UV) or blue light having a short wavelength and provide an excellent effect filtering for the ultraviolet light or blue light of short wavelengths, and exhibit an excellent effect of transmission for visible light having a relatively long wavelength and allows for improvement of filtering effect by adjusting molecular structures thereof. As shown in FIG. 5, a polyimide film shows a high transmission rate for light of wavelength of 380-780 nm and has an abruptly lowered transmission rate for short wavelength light having a wavelength less than 380 nm to thus provide an excellent effect of filtering for ultraviolet light having a short wavelength.

The protective filter layer 4 provides dense protection to the quantum dot layer 3 to prevent damages induced on the quantum dot layer 3 by subsequent manufacturing process (such as development operation and water washing operation of the color filter layer) and also to prevent impurities contained in the quantum dot paste from entering the liquid crystal to affect the performance of displaying. Further, the protective filter layer 4 also provides an effect of light filtering and may prevent a portion of UV backlighting or laser backlighting, which remains after the backlighting has been used to excite the quantum dots, from transmitting out. Taking a quantum dot layer 3 of which the color of emission light is red or green and the backlighting emitting from a backlight module being blue light as an example, the arrangement of the protective filter layer 4 can be used to filter off blue light to prevent a remaining portion the blue light that has not been put into effect in exciting the quantum dot layer 3 from transmitting through the protective filter layer 4 after the blue light has been applied for excitement purpose, so as to increase the emission efficiency of the quantum dot layer 3, while the protective filter layer 4 allows red or green light to transmit therethrough for color displaying.

Further, the array substrate can be a COA array substrate, and in this case, the array substrate manufacturing method further comprises: Step 4, in which a color filter layer 5 is formed on the protective layer 4.

In summary, the present invention provides an array substrate. The array substrate comprises a quantum dot layer, and a protective filter layer is formed on the quantum dot layer. The quantum dot layer helps improve color saturation and color purity and expands the range of color gamut. The protective filter layer provide dense protection to the quantum dot layer to prevent damages induced on the quantum dot layer by subsequent manufacturing processes and also prevents impurities contained in the quantum dot paste from entering the liquid crystal layer to affect the performance of displaying. Further, the protective filter layer provides an effect of light filtering and may prevent a portion of UV backlighting or laser backlighting, which remains after the backlighting has been used to excite the quantum dots, from transmitting therethrough so as to improve the efficiency and stability of the quantum dot layer. The present invention also provides an array substrate manufacturing method. The method can be easily carried out and forms a quantum dot layer on an array substrate to supplement the insufficiency of color displaying of a conventional color filter layer and expand the range of color gamut. By forming a protective filter layer on the quantum dot layer, the efficiency and stability of the quantum dot layer can be improved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An array substrate manufacturing method, comprising the following steps:
   (1) providing a base plate and forming a thin-film transistor (TFT) layer on the base plate;
   (2) forming a quantum dot layer on the TFT layer, where the quantum dot layer is adapted to convert blue color into light in a wavelength range covering one of red and green colors; and
   (3) forming a protective filter layer on the quantum dot layer, wherein the protective filter layer provides an effect of light filtering so as to allow the light in the wavelength range covering red and green colors to transmit therethrough and prevent the light of blue color from transmitting therethrough.

2. The array substrate manufacturing method as claimed in claim 1, wherein Step 2 is specifically performed by applying a vapor deposition process to form a quantum dot film on the TFT layer so as to form the quantum dot layer.

3. The array substrate manufacturing method as claimed in claim 1, wherein Step 2 is specifically performed by providing a quantum dot material and a dissolving medium, dissolving and dispersing the quantum dot material in the dissolving medium and uniformly mixed to form a quantum dot paste, and applying the quantum dot paste to form a film on the TFT layer and drying and curing to obtain the quantum dot layer.

4. The array substrate manufacturing method as claimed in claim 3, wherein in Step 2, the quantum dot material is oil soluble or water soluble; the quantum dots are in the form of spheres, bars, or fibrous forms; the dissolving medium is silica series or epoxy series; and in Step 2 the quantum dot paste is applied to the TFT layer to form the film by means of spray coating, spin coating, printing, or slot-die coating.

5. The array substrate manufacturing method as claimed in claim 1 further comprising the following step:
   (4) forming a color filter layer on the protective layer.

6. An array substrate manufacturing method, comprising the following steps:
   (1) providing a base plate and forming a thin-film transistor (TFT) layer on the base plate;
   (2) forming a quantum dot layer on the TFT layer; and
   (3) forming a protective filter layer on the quantum dot layer, wherein the protective filter layer provides an effect of light filtering so as to allow light in a wavelength range covering red and green colors to transmit therethrough and prevent light in a wavelength range covering blue color from transmitting therethrough.

7. The array substrate manufacturing method as claimed in claim 6, wherein Step 2 is specifically performed by applying a vapor deposition process to form a quantum dot film on the TFT layer so as to form the quantum dot layer.

8. The array substrate manufacturing method as claimed in claim 6, wherein Step 2 is specifically performed by providing a quantum dot material and a dissolving medium, dissolving and dispersing the quantum dot material in the dissolving medium and uniformly mixed to form a quantum dot paste, and applying the quantum dot paste to form a film on the TFT layer and drying and curing to obtain the quantum dot layer.

9. The array substrate manufacturing method as claimed in claim 8, wherein in Step 2, the quantum dot material is oil soluble or water soluble; the quantum dots are in the form of spheres, bars, or fibrous forms; the dissolving medium is silica series or epoxy series; and in Step 2 the quantum dot paste is applied to the TFT layer to form the film by means of spray coating, spin coating, printing, or slot-die coating.

10. The array substrate manufacturing method as claimed in claim 6 further comprising the following step:
    (4) forming a color filter layer on the protective layer.

11. An array substrate manufacturing method, comprising the following steps:

(1) providing a base plate and forming a thin-film transistor (TFT) layer on the base plate;
(2) forming a quantum dot layer on the TFT layer; and
(3) forming a protective filter layer on the quantum dot layer, wherein the protective filter layer provides an effect of light filtering so as to allow exclusively light in the wavelength range covering one of red and green colors to transmit therethrough.

12. The array substrate manufacturing method as claimed in claim 11, wherein Step 2 is specifically performed by applying a vapor deposition process to form a quantum dot film on the TFT layer so as to form the quantum dot layer.

13. The array substrate manufacturing method as claimed in claim 11, wherein Step 2 is specifically performed by providing a quantum dot material and a dissolving medium, dissolving and dispersing the quantum dot material in the dissolving medium and uniformly mixed to form a quantum dot paste, and applying the quantum dot paste to form a film on the TFT layer and drying and curing to obtain the quantum dot layer.

14. The array substrate manufacturing method as claimed in claim 13, wherein in Step 2, the quantum dot material is oil soluble or water soluble; the quantum dots are in the form of spheres, bars, or fibrous forms; the dissolving medium is silica series or epoxy series; and in Step 2 the quantum dot paste is applied to the TFT layer to form the film by means of spray coating, spin coating, printing, or slot-die coating.

15. The array substrate manufacturing method as claimed in claim 11 further comprising the following step:
(4) forming a color filter layer on the protective layer.

* * * * *